(12) United States Patent
Komuro et al.

(10) Patent No.: US 7,248,200 B2
(45) Date of Patent: Jul. 24, 2007

(54) ANALOG TO DIGITAL CONVERSION METHOD USING TRACK/HOLD CIRCUIT AND TIME INTERVAL ANALYZER, AND AN APPARATUS USING THE METHOD

(75) Inventors: Takanori Komuro, Tokyo (JP); Jochen Rivoir, Magstadt (DE)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 11/397,469

(22) Filed: Apr. 4, 2006

(65) Prior Publication Data

US 2006/0238398 A1 Oct. 26, 2006

(30) Foreign Application Priority Data

Apr. 22, 2005 (JP) .............................. 2005-124625

(51) Int. Cl.
*H03M 1/50* (2006.01)
(52) U.S. Cl. ...................................... 341/166; 341/155

(58) Field of Classification Search ......... 341/160–169
See application file for complete search history.

(56) References Cited

U.S. PATENT DOCUMENTS

| 3,912,880 | A | * | 10/1975 | Powter et al. ........... 379/27.08 |
| 5,138,875 | A | * | 8/1992 | Booer ...................... 73/152.47 |
| 6,429,799 | B1 | | 8/2002 | Kamas et al. ................ 341/155 |
| 6,462,693 | B1 | | 10/2002 | Rivoir ........................ 341/155 |
| 6,717,540 | B1 | | 4/2004 | Kamas et al. ................ 341/155 |
| 7,023,373 | B2 | * | 4/2006 | da Fonte Dias ............. 341/162 |
| 7,072,717 | B1 | * | 7/2006 | Wolf et al. .................... 607/57 |
| 7,139,604 | B1 | * | 11/2006 | Mouchawar et al. ........ 600/509 |
| 7,148,834 | B2 | * | 12/2006 | da Fonte Dias ............. 341/162 |

\* cited by examiner

*Primary Examiner*—Lam T. Mai

(57) ABSTRACT

An analog signal is sampled; a reference signal synchronized to the sampling is generated; the sampling result is compared to said reference signal; the time interval from the sampling point to the time the comparison result satisfies the prescribed condition is acquired; and the amplitude of the digital representation is determined from the acquired time interval and knowledge of the reference signal.

30 Claims, 3 Drawing Sheets

ANALOG TO DIGITAL CONVERSION METHOD USING TRACK/HOLD CIRCUIT AND TIME INTERVAL ANALYZER, AND AN APPARATUS USING THE METHOD

FIELD OF THE INVENTION

The present invention relates to an analog-to-digital conversion method, and more particularly, relates to a method for digitally converting an analog signal by using temporal information such as the time stamp and the time interval.

DISCUSSION OF THE BACKGROUND ART

One method for converting an analog signal to a digital representation is the SinCT method. The SinCT method compares the analog signal to a reference signal, and uses the time stamp of the time when the magnitude relationship of the two signals satisfies the prescribed condition to convert an analog signal to a digital amplitude sequence (i.e., see Unexamined Japanese Patent Publication (Kokai) No. 2003-124,810 or U.S. Pat. No. 6,717,540).

The information obtained by the SinCT method includes the time stamps having an irregular interval and the amplitudes of the reference signal corresponding to these time stamps. In other words, the SinCT method differs from a conventional analog-to-digital conversion method; the sampling time interval is not constant. On the other hand, generally, the result of the analog-to-digital conversion often requires the amplitudes at times having a constant interval. For example, the fast Fourier transform (FFT) requires a collection of the digital amplitudes at times having a constant interval. Consequently, a process is needed to convert the information obtained by the SinCT method into amplitudes at times having a constant interval. This conversion process is referred to as gridding. For example, gridding is performed by interpolation or polynomial approximation, and needs a long computation time or many computational resources. For example, a 1024-point gridding requires several seconds of processing time when processing on a computer equipped with a processor having a clock frequency of 1 GHz. When digital automatic test equipment (digital ATE) is used to obtain a digital amplitude sequence at times having a constant interval from an analog signal, a shorter time required for gridding is desired.

SUMMARY OF THE INVENTION

A method for digitally converting an analog signal and includes a first step for sampling the above-mentioned analog signal, a second step for generating a reference signal synchronized to the above-mentioned sampling, a third step for comparing the above-mentioned sampling result to the above-mentioned reference signal, a fourth step for acquiring the time interval from the above-mentioned sampling time up to the time that the above-mentioned comparison result satisfies the prescribed condition, and a fifth step for determining the amplitude of the digital representation from the above-mentioned acquired time interval and knowledge relative to the above-mentioned reference signal.

A method for digitally converting an analog signal and includes a first step for sampling the above-mentioned analog signal, a second step for generating in parallel at least two reference signals with different main level ranges and synchronized to the above-mentioned sampling, a third step for comparing in parallel the result of the above-mentioned sampling to each of the above-mentioned reference signals, a fourth step for acquiring each time interval from the above-mentioned sampling time up to the time that each of the above-mentioned comparison results satisfies the prescribed condition; and a fifth step for determining the amplitude of the digital representation from one of the above-mentioned acquired time intervals and knowledge relative to the above-mentioned related reference signal.

A method for digitally converting an analog signal and includes a first step for sampling the above-mentioned analog signal at N different times, for N of at least 2; a second step for generating in parallel N reference signals synchronized to each of the above-mentioned N times; a third step for comparing the above-mentioned N sampling results to each of the above-mentioned related N reference signals; a fourth step for acquiring the time interval from said time up to the time that the above-mentioned related comparison result satisfies the prescribed condition; and a fifth step for determining the amplitude of the digital representation from the above-mentioned acquired time interval and knowledge relative to the above-mentioned related reference signal.

Preferably, the maximum level of the above-mentioned reference signal greater than the maximum level of the above-mentioned analog signal, and the minimum level of the above-mentioned reference signal less than the minimum level of the above-mentioned analog signal. The above-mentioned reference signal as a filtered binary signal. The above-mentioned reference signal as a cosine wave signal or a sine wave signal.

Optionally, the present invention may include a sixth step for connecting the above-mentioned determined amplitudes to times having a constant interval.

A system for digitally converting an analog signal and comprises an apparatus for sampling the above-mentioned analog signal, a reference signal source for generating the reference signal synchronized to the sampling by the above-mentioned sampling apparatus, a comparator for comparing the sampling result of the above-mentioned sampling apparatus to the above-mentioned reference signal, a time interval analyzer for acquiring the time interval from the sampling time of the above-mentioned sampling apparatus up to the time that the comparison result of the above-mentioned comparator satisfies the prescribed condition, and a calculating apparatus for determining the amplitude of the digital representation from the above-mentioned acquired time interval and knowledge relative to the above-mentioned reference signal.

A system for digitally converting an analog signal and comprises an apparatus for sampling the above-mentioned analog signal; N reference signal sources, where N is at least 2, for generating reference signals in mutually different main level ranges synchronized to the sampling of the above-mentioned sampling apparatus; N comparators for comparing the sampling result of the above-mentioned sampling apparatus to the mutually different above-mentioned reference signals; N time interval analyzers for acquiring the time interval from the sampling time by the above-mentioned sampling apparatus up to the time that the comparison results of the mutually different above-mentioned comparators satisfy the prescribed condition; and a calculating apparatus for determining the amplitude of the digital representation from one of the above-mentioned acquired time intervals and knowledge relative to the above-mentioned related reference signal.

A system for digitally converting an analog signal and comprises N sampling apparatuses, where N is at least 2, for sampling the above-mentioned analog signal at mutually different times; N reference signal sources for generating reference signals synchronized to the sampling by the above-mentioned mutually different sampling apparatuses; N comparators for comparing the above-mentioned sampling results of the above-mentioned mutually different sampling apparatuses to the above-mentioned related reference signal; N time interval analyzers for acquiring the time intervals from the sampling times of the above-mentioned mutually different sampling apparatuses up to the time that the comparison results of the above-mentioned related comparators satisfy the prescribed condition; and a calculating apparatus for determining the amplitude of the digital representation from one of the above-mentioned acquired time intervals and knowledge relative to the above-mentioned related reference signal.

Preferably, the maximum level of the above-mentioned reference signal greater than the maximum level of the above-mentioned analog signal, and the minimum level of the above-mentioned reference signal less than the minimum level of the above-mentioned analog signal. The above-mentioned reference signal source comprising a signal source for outputting binary signals and a filter for filtering the output signal of said signal source. Preferably, the above-mentioned reference signal is a cosine wave signal or a sine wave signal.

Optionally, the present invention further comprises a means for connecting the above-mentioned determined amplitudes to times having a constant interval.

The present invention has the following effects compared to the prior art. According to the present invention, digital automatic test equipment (digital ATE) can be used to obtain a sequence of digital amplitudes at times having a constant interval from an analog signal without gridding. According to the present invention, a modulated pulse is the reference signal, and a digital ATE easily generates the reference signal needed in the analog-to-digital conversion. Further, according to the present invention, the reference signal is synchronized to the sampling cycle, and the time interval analysis needed in analog-to-digital conversion becomes simple.

DETAILED DESCRIPTION OF THE PREFERRED EMBODIMENT

Figure 1:
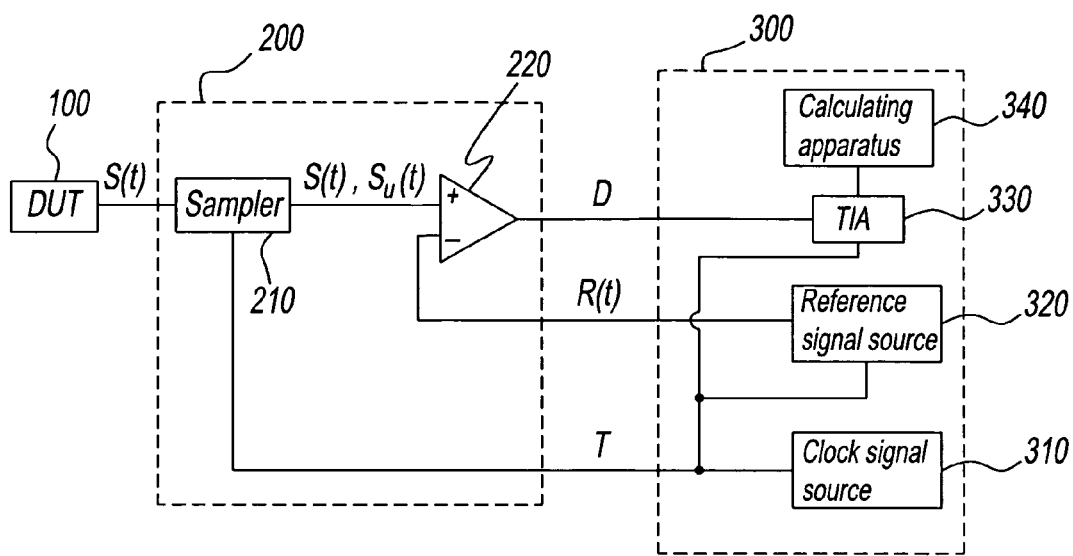
FIG. 1 is a schematic diagram showing the configuration of the A/D conversion system 10, which is a first and a second embodiment of the present invention.

Referring to the attached drawings, preferred embodiments of the present invention are explained. A first embodiment of the present invention is an analog-to-digital conversion system 10 shown in FIG. 1. Below, FIG. 1 is referenced. In this Specification, the analog-to-digital conversion system is referred to as the A/D conversion system. First, the A/D conversion system 10 is explained. The A/D conversion system 10 comprises automatic test equipment (ATE) 300, which is an example of the measuring apparatus, and an adapter 200 connected to the ATE 300. The adapter 200 comprises a sampler 210 and a comparator 220. The ATE 300 comprises a clock signal source 310, a reference signal generator 320, a time interval analyzer 330, and a calculating apparatus 340.

The sampler 210 is an apparatus for sampling a signal under test S(t), which is the output signal of a device under test 100, in response to a clock signal T. The device under test 100 is referred to as the DUT. The operations of the sampler 210 include the track-and-hold mode and the sample-and-hold mode. The sampler 210 in the track-and-hold mode enters the track state where a signal tracking the signal under test S(t) is output in response to the output signal level of the clock signal source 310, or the hold state where the signal under test S(t) is held and the held signal is output. The sampler 210 in the sample-and-hold mode outputs the held signal under test S(t) in response to the positive edge, or the negative edge, or both edges of the output signal of the clock signal source 310. In this embodiment, the sampler 210 operates in the track-and-hold mode. When the clock signal T has a low logic level (low), the sampler 210 enters the track state and outputs the signal S(t). On the other hand, when the clock signal has a high logic level (high), the sampler 210 enters the hold state and outputs the signal SH(t), which is the hold result.

The clock signal source 310 is an apparatus for generating the clock signal T. In this embodiment, the clock signal T is a rectangular wave signal repeating with a constant period and is supplied to the sampler 210, the reference signal source 320, and the time interval analyzer 330. The clock signal T can have any shape if the prescribed times having a constant interval can be determined. For example, the waveform of clock signal T is not limited to a rectangular wave, but may be other waveforms, such as a sine wave, a sawtooth wave, or a triangular wave.

The comparator 220 is the apparatus for comparing two input signals and outputting the comparison result. The output signal of the sampler 210 and the output signal of the reference signal generator 320 are applied to the comparator 220. An output signal D of the comparator 220 is a binary logic signal. When the output signal of the sampler 210 is greater than the output signal of the reference signal generator 320, the output signal of the comparator 220 outputs a high logic level (high). When the output signal of the sampler 210 is less than the output signal of the reference signal generator 320, the output signal of the comparator 220 outputs a low logic level (low). When the output signal of the sampler 210 and the output signal of the reference signal generator 320 have the same level, the output signal of the comparator 220 outputs the preceding logic level.

The reference signal generator 320 is the apparatus for generating a known reference signal R(t). The reference signal R(t) is synchronized to the clock signal T with the period ratio 1:M, where M is an integer. For example, when M is 2, the period of the clock signal T becomes twice the period of the reference signal R(t). Although explained earlier, as a precaution, synchronization means that the periods of two or more periodic events are the same, or have an integral ratio. The maximum level of the reference signal R(t) is greater than the maximum level of the signal under test S(t). The minimum level of the reference signal R(t) is less than the minimum level of the signal under test S(t). The waveform of the reference signal R(t) is not limited to a cosine wave, but may be another waveform, for example, a sine wave, a sawtooth wave, a triangle wave, or a rectangular wave. In this embodiment, the reference signal R(t) is a cosine wave signal repeating with the same period as the clock signal T. The reference signal generator 320 comprises a digital signal source Z and a filter F, which are not shown. The digital signal source Z outputs a modulated binary signal (digital signal). The filter F filters the digital signal. The filter F is separated from the reference signal source 320 and can be provided in the adapter 200. The modulation of the digital signal source Z may be any modulation method able to represent the desired analog signal by a binary pulse representation, such as a delta sigma modulation or a pulse width modulation (PWM).

The time interval analyzer 330 is the apparatus for detecting the transition of the input signal, acquiring the time stamp of the detected transition, and measuring the time interval of the detected transition period. The output signal D of the comparator 220 and the clock signal T are applied to the time interval analyzer 330. The time interval analyzer 330 is referred to as the time interval analyzer or the transition analyzer, and is abbreviated as TIA.

The calculating apparatus 340 is the apparatus for processing the analysis results of the time interval analyzer 330. The calculating apparatus 340 obtains knowledge of the reference signal R(t) for the process. In this Specification, the signal knowledge represents the signal and is a function of time. Or, the signal knowledge represents the relationship between the time and the signal amplitude. The calculating apparatus 340, for example, is an application-specific integrated circuit (ASIC), a field-programmable gate array (FPGA), a digital signal processor (DSP) or a CPU, a personal computer or a workstation.

Figure 2:
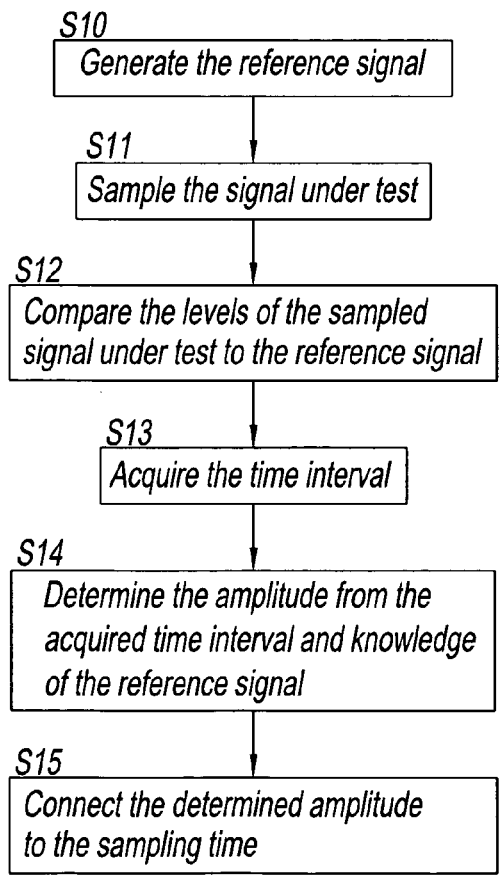
FIG. 2 is a flow chart illustrating the operation of A/D conversion system 10 as the first and the second embodiment of the present invention.
Figure 3:
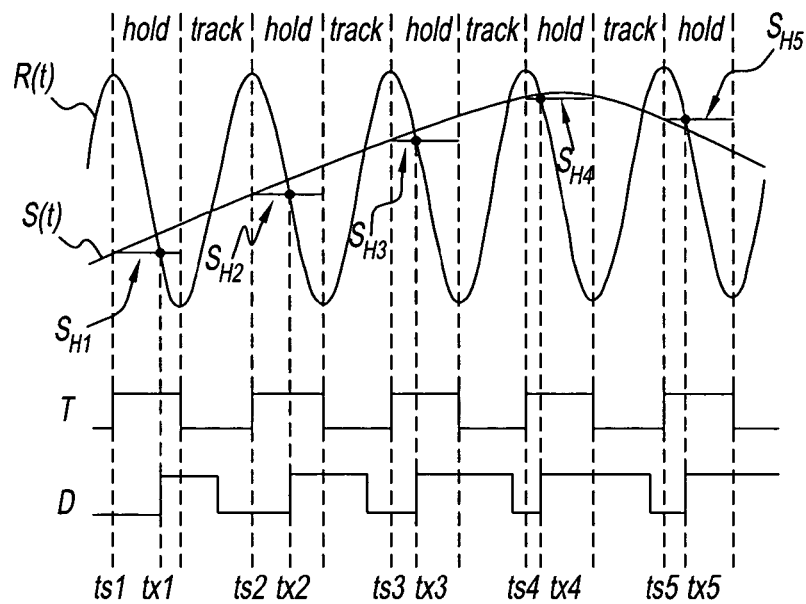
FIG. 3 is a timing chart showing the transitions of each signal in AID conversion system 10 as the first embodiment of the present invention.

Next, the operation of the A/D conversion system 10 is explained. In addition to FIG. 1, FIGS. 2 and 3 are referenced. FIG. 2 is a flow chart illustrating the operation of the A/D conversion system 10. FIG. 3 is a timing chart showing the appearance of each signal in the A/D conversion system 10. In FIG. 3, the vertical axis represents the amplitude level, and the horizontal axis represents the time. In FIG. 3, H and L are the logic levels.

[Step S10] First, the sampler 210 samples the signal under test S(t) in response to the clock signal T. The signal under test S(t) is sampled when the level of the clock signal T transitions from low to high. The sampling result is held for the high level period of the clock signal T. Consequently, the signal under test S(t) is held (sampled) by the sampler 210 at times ts1, ts2, ts3, ts4, and ts5, respectively, and the corresponding hold results $SH_1$, $SH_2$, $SH_3$, $SH_4$, and $SH_5$ are output. The hold results $SH_1$, $SH_2$, $SH_3$, $SH_4$, and $SH_5$ form the signal $S_H(t)$.

[Step S11] A cosine wave signal R(t) repeating with the same period as the clock signal T is generated by the reference signal source 320 and applied to the comparator 220.

[Step S12] The output signal of the sampler 210 and the cosine wave signal R(t), which is the reference signal, are compared in the comparator 220. The magnitude relationship of the two signal levels changes from time tx1 to tx5. This change produces a transition in signal D showing the comparison result.

[Step S13] The time interval analyzer 330 measures the time intervals between the signal D transition and the clock signal D transition. This time interval is based on a positive edge of the clock signal T and can be measured as a relative time stamp of the positive edge of signal D.

[Step S14] Knowledge of the reference signal R(t) is known beforehand. The reference signal R(t) is synchronized to the clock signal T. Consequently, in the calculating apparatus 340, by referring to the time interval (relative time stamp) measured in Step S13 and knowledge of the reference signal R(t), the digital amplitudes can be obtained at the sampling times ts1, ts2, ts3, ts4, and ts5.

[Step S15] The obtained digital amplitudes are connected to become a sequence of digital amplitudes at times having a constant interval. For example, when the signal under test S(t) is sampled by a real-time sampling method, the sequence of digital amplitudes at times having a constant interval is obtained if arranged in the order that the digital amplitudes were obtained. When the signal under test S(t) is sampled by an equivalent time sampling method, the sequence of digital amplitudes at times having a constant interval is obtained by rearranging the digital amplitudes while referring to the corresponding sampling times. The connection result is stored in a memory apparatus, which is not shown, or output to another apparatus, which is not shown. This completes the explanation of the first embodiment.

Figure 4:
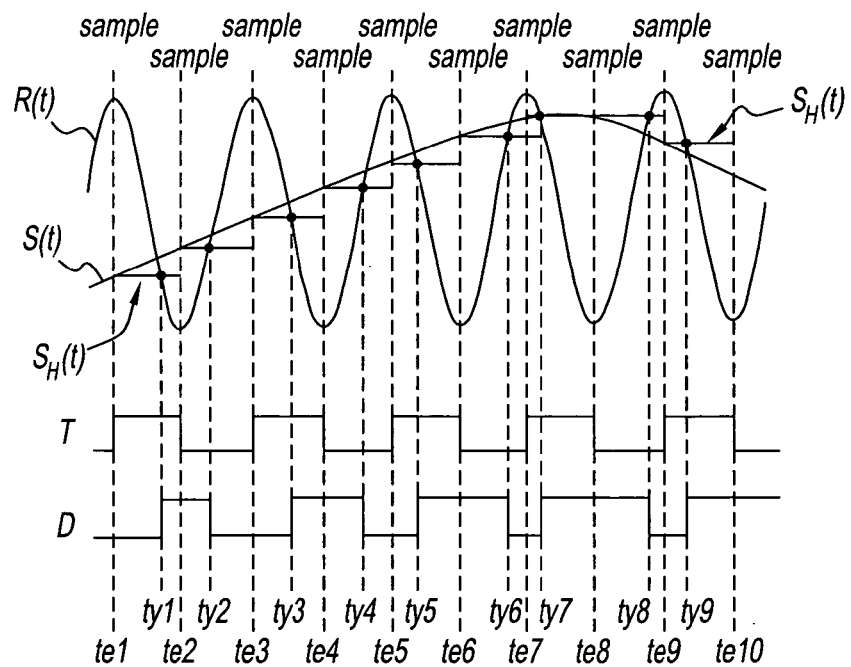
FIG. 4 is a timing chart showing the transitions of each signal in A/D conversion system 20 as the second embodiment of the present invention.

Next, a second embodiment is explained for an A/D conversion system 10 when the sampler 210 is operating in the sample-and-hold mode and samples in response to both edges of the clock signal T. The configuration is the same; therefore, only the operation is explained. Below, FIGS. 1, 2, and 4 are referenced. FIG. 4 is a timing chart showing the appearance of each signal in the A/D conversion system 10 as the second embodiment. In FIG. 4, the vertical axis represents the amplitude level. The horizontal axis represents the time. In FIG. 4, H and L are the logic levels.

[Step S20] First, the sampler 210 samples the signal under test S(t) in response to the clock signal T. The signal under test S(t) is sampled at the times of the positive edge and the negative edge of the clock signal T. The sampled result is held until the next sample. Consequently, the signal under test S(t) is held (sampled) by the sampler 210 at each time from te1 to te10. The hold result corresponding to each time is output. These hold results form the signal $S_H(t)$.

[Step S21] The cosine wave signal R(t) repeating with the same period as the clock signal T is generated by the reference signal source 320 and is applied to the comparator 220.

[Step S22] The output signal of the sampler 210 and the cosine wave signal R(t), which is the reference signal, are compared in the comparator 220. The magnitude relationship of the levels of the two signals changes at times ty1 to ty10. These changes produce transitions in signal D showing the comparison result.

[Step S23] The time interval analyzer 330 measures the time intervals between the transition of signal D and the transition of clock signal T. These time intervals can be measured as the relative time stamp of the positive edge of signal D with the positive edge of the clock signal T as the reference.

[Step S24] Knowledge of the reference signal R(t) is known beforehand. The reference signal R(t) is synchronized to the clock signal T. By referring to the time interval (relative time stamp) measured in Step S13 and knowledge of the reference signal R(t), the calculating apparatus 340 can obtain the digital amplitudes for each sampling time of te1 to te10.

[Step S25] The obtained digital amplitudes are connected into a sequence of digital amplitudes at times having a constant interval. The arrangement (connection) of the digital amplitudes is the same as in Step S15. The connection result is stored in a memory apparatus, which is not shown, or output to another apparatus, which is not shown.

A/D conversion system 10 as the second embodiment effectively uses the transitions of the reference signal and obtains twice the sampling cycle compared to A/D conversion system 10 as the first embodiment. The sampler 210 is operated in the track-and-hold mode and needs to guarantee sufficient tracking time when an equal sampling cycle is implemented. The tracking time is guaranteed by making the width of the reference signal level wider than the full width of the level of the signal under test. This completes the explanation of the second embodiment.

Preferably, the reference signal R(t) uniformly and gradually level sweeps at least the full width of the signal under test S(t) within one period of the sampling cycle. As the slope of the amplitude corresponding to the time of the reference signal becomes less steep, the final precision and resolution of the digital amplitudes obtained can be improved. The following two methods produce a less steep slope for the amplitude corresponding to the time of the reference signal. One method divides the full width of the signal under test S(t) into a plurality of intervals in the level direction, and the reference signal that level sweeps the fill width of each interval is generated in each interval. The second method prepares a plurality of the A/D conversion systems 10 described as the first embodiment. Each operates synchronized to a slightly offset time, in other words, in an interleaving method.

Figure 5:
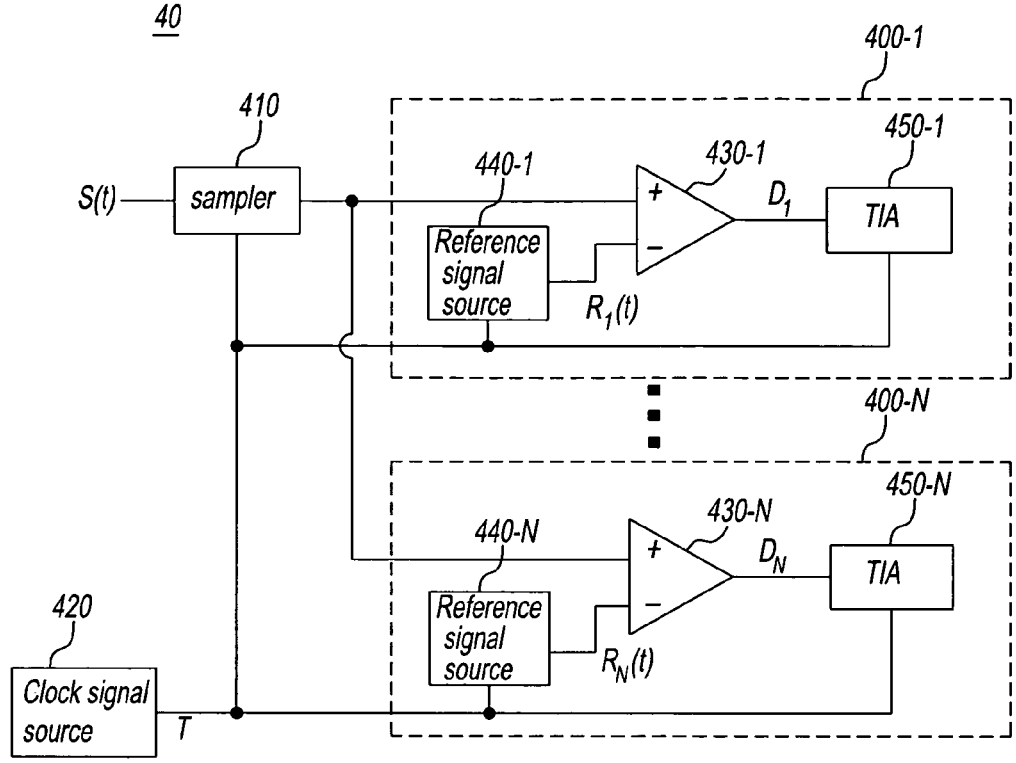
FIG. 5 is a schematic diagram showing the configuration of A/D conversion system 40, which is a third embodiment of the present invention.

For example, the system implementing the first method has the configuration shown in FIG. 5. An A/D conversion system 40 shown in FIG. 5 is a third embodiment of the present invention. The A/D conversion system 40 comprises a sampler 410, a clock signal source 420, and N modules (400-1 to -N). Each module (400-1 to -N) comprises a comparator (430-1 to -N), a reference signal source (440-1 to -N), and a time interval analyzer (450-1 to -N). In each time interval analyzer (450-1 to -N), at least one calculating apparatus, which is not shown, is connected to the entire system, or at least one is connected to each module (400-1 to -N)

Unless explicitly stated, the configuration and operation of each component and the operation of the entire system invoke the explanation of the first embodiment. A point to be noted is a mutually different main level range for the reference signal $R_i(t)$, which is the output signal of reference signal source 440-i, where i is $1 \leq i \leq N$. The level ranges of the reference signals $R_1(t)$ to $R_N(t)$ are arranged to be adjacent or overlap slightly. The set of reference signals $R_1(t)$ to $R_N(t)$ includes the full width of the signal under test S(t).

The operation of the AID conversion system 40 is briefly described below. A clock signal source 420 generates the clock signal T. The clock signal T is supplied to the sampler 410, each reference signal source (440-1 to -N), and the time interval analyzers (450-1 to -N). The sampler 410 samples the signal under test S(t) in response to the clock signal T. Each comparator (430-1 to -N) compares the output signal of the sampler 410 and the related reference signal $R_i(t)$. The reference signal $R_i(t)$ is a known signal perfectly synchronized to the clock signal T with the period ratio 1:M. Then the time interval between the clock signal T and each signal $D_1$ to $D_N$ is measured to obtain N measurements. The calculating apparatus, which is not shown, refers to at least one of these measurements and the related knowledge of the reference signal and obtains one digital amplitude value. The connection to the times having a constant interval is the same as explained above.

Figure 6:
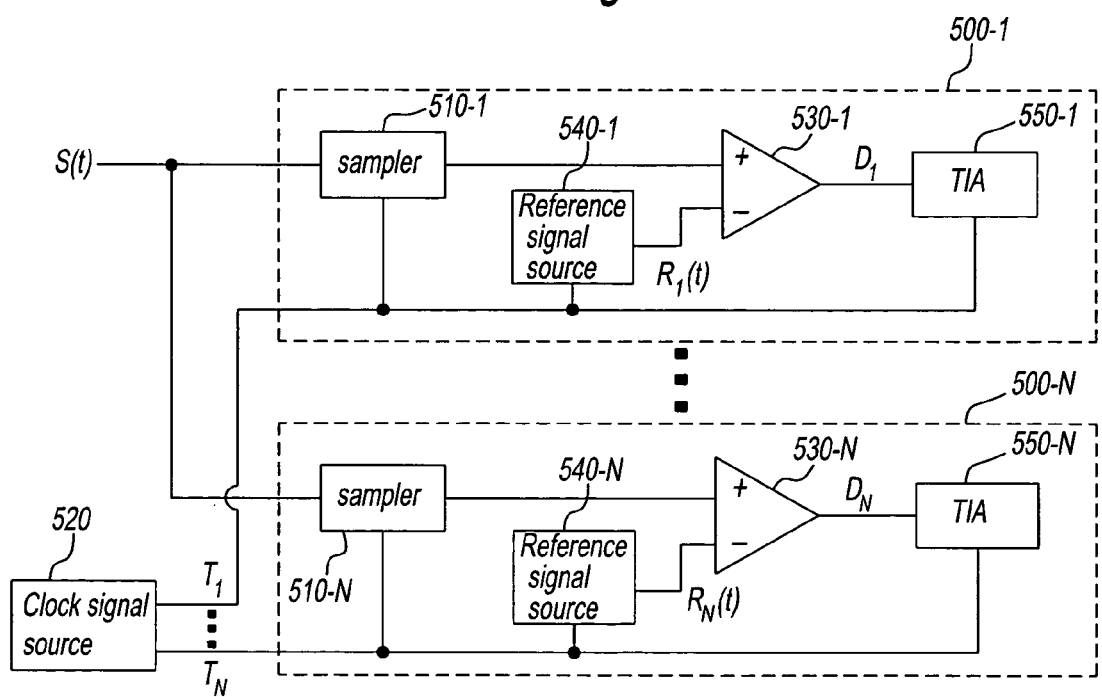
FIG. 6 is a schematic diagram showing the configuration of A/D conversion system 50, which is a fourth embodiment of the present invention.

A system implementing the second method has, for example, the configuration shown in FIG. 6. An A/D conversion system 50 shown in FIG. 6 is a fourth embodiment of the present invention. The A/D conversion system 50 comprises a clock signal generator 520 and N modules (500-1 to -N). Each module (500-1 to -N) comprises a sampler (510-1 to -N), a comparator (530-1 to -N), a reference signal source (540-1 to -N), and a time interval analyzer (550-1 to -N), respectively. In each time interval analyzer (550-1 to -N), at least one calculating apparatus, which is not shown, is connected to the entire system, or at least one is connected to each module (500-1 to -N).

Unless explicitly stated, the configuration and operation of each component and the operation of the entire system invoke the explanation of the first embodiment. A point to be noted is that the clock signals ($T_1$ to $T_N$) generated by the clock signal source 520 notify the interleaving times.

The operation of the A/D conversion system 50 is briefly described as follows. As described above, the clock signal source 520 generates the clock signals ($T_1$ to $T_N$). The clock signal T is supplied to the sampler (510-1 to -N), the reference signal sources (540-1 to -N) and the time interval analyzers (550-1 to -N). In each module (500-1 to -N), the time interval is measured synchronized to each clock signal ($T_1$ to $T_N$). The calculating apparatus, which is not shown, obtains the digital amplitude while referring to these time interval measurements and knowledge of the related reference signal. The connection to the times having a constant interval is the same as explained above.

The A/D conversion system 40 and the A/D conversion system 50 can be divided and loaded into an adapter and an ATE. The present invention also can be applied to the built-in self test (BIST) because the adapter is easily loaded in the DUT.

What is claimed is:

1. A method for digitally converting an analog signal comprising:
    sampling said analog signal at a sampling time, and yielding a sampling result;
    generating a reference signal synchronized to said sampling;
    comparing said sampling result to said reference signal, and yielding a comparison result;
    acquiring a time interval from said sampling time until a time said comparison result satisfies a prescribed condition; and
    determining an amplitude of a digital representation from said time interval and knowledge of said reference signal.

2. The method according to claim 1, wherein a maximum level of said reference signal is greater than a maximum level of said analog signal, and a minimum level of said reference signal is less than a minimum level of said analog signal.

3. The method according to claim 1, wherein said reference signal is a filtered binary signal.

4. The method according to claim 1, wherein said reference signal is a cosine wave signal or a sine wave signal.

5. The method according to claim 1, further comprising: connecting said amplitude to a time having a constant interval.

6. A method for digitally converting an analog signal comprising: sampling said analog signal at a sampling time, and yielding a sampling result;
generating in parallel, a first reference signal and a second reference signal, wherein said first and second reference signals have different main level ranges and are synchronized to said sampling;
comparing in parallel said sampling result to each of said first and second reference signals, and yielding a first comparison result and a second comparison result;
acquiring a first time interval from said sampling time until a time said first comparison results satisfies a prescribed condition, and acquiring a second time interval from said sampling time until a time said second comparison result satisfies said prescribed condition; and
determining an amplitude of a digital representation from at least one of (a) said first time interval and knowledge of said first reference signal, or (b) said second time interval and knowledge of said second reference signal.

7. The method according to claim 6, wherein a maximum level of said first reference signal is greater than a maximum level of said analog signal, and a minimum level of said first reference signal is less than a minimum level of said analog signal.

8. The method according to claim 6, wherein said first reference signal is a filtered binary signal.

9. The method according to claim 6, wherein said first reference signal is a cosine wave signal or a sine wave signal.

10. The method according to claim 6, further comprising: connecting said amplitude to a time having a constant interval.

11. A method for digitally converting an analog signal comprising:
sampling said analog signal at N different times, and yielding N sampling results, where N is at least 2;
generating in parallel N reference signals synchronized to each of said N times;
comparing said N sampling results to each of said related N reference signals, and yielding N comparison results;
acquiring a time interval from said N different times until a time a related one of said N comparison results satisfies a prescribed condition, and yielding N time intervals; and
determining the amplitudes of the an amplitude of a digital representation from said N time intervals and knowledge of said related reference signal a related one of said N reference signals.

12. The method according to claim 11, wherein a maximum level of at least one of said N reference signals is greater than a maximum level of said analog signal, and a minimum level of at least one of said N reference signals is less than a minimum level of said analog signal.

13. The method according to claim 11, wherein at least one of said N reference signals is a filtered binary signal.

14. The method according to claim 11, wherein at least one of said N reference signals is a cosine wave signal or a sine wave signal.

15. The method according to claim 11, further comprising:
connecting said amplitude to a time having a constant interval.

16. A system for digitally converting an analog signal which comprises:
a sampler for sampling said analog signal at a sampling time, and yielding a sampling result;
a reference signal source for generating a reference signal synchronized to said sampling;
a comparator for comparing said sampling result to said reference signal, and yielding a comparison result;
a time interval analyzer for acquiring a time interval from said sampling time until a time said comparison result satisfies a prescribed condition; and
a calculating apparatus for determining an amplitude of a digital representation from said time interval and knowledge of said reference signal.

17. The system according to claim 16, wherein a maximum level of said reference signal is greater than a maximum level of said analog signal, and a minimum level of said reference signal is less than a minimum level of said analog signal.

18. The system according to claim 16, wherein said reference signal source comprises a signal source for outputting binary signals and a filter for filtering said binary signals.

19. The system according to claim 16, wherein said reference signal is a cosine wave signal or a sine wave signal.

20. A system for digitally converting an analog signal which comprises:
a sampler for sampling said analog signal at a sampling time, and yielding a sampling result;
N reference signal sources, where N is at least 2, for generating N reference signals in mutually different main level ranges synchronized to said sampling;
N comparators for comparing said sampling result to said N reference signals, and yielding N comparison results;
N time interval analyzers for acquiring a time interval from said sampling time until a time said N comparison results satisfy a prescribed condition, and yielding N time intervals; and
a calculating apparatus for determining an amplitude of a digital representation from one of said N time intervals and knowledge of a related one of said N reference signals.

21. The system according to claim 20, wherein a maximum level of at least one of said N reference signals is greater than a maximum level of said analog signal, and a minimum level of at least one of said N reference signals is less than a minimum level of said analog signal.

22. The system according to claim 20, wherein at least one of said N reference signal sources comprises a signal source for outputting binary signals and a filter for filtering said binary signals.

23. The system according to claim 20, wherein at least one of said N reference signals is a cosine wave signal or a sine wave signal.

24. A system for digitally converting an analog signal which comprises:
N samplers, where N is at least 2, for sampling said analog signal at mutually different times and yielding N sampling results;
N reference signal sources for generating N reference signals synchronized to said sampling;
N comparators for comparing said N sampling results of said mutually different sampling to said related N reference signals, and yielding N comparison results;
N time interval analyzers for acquiring a time interval from said mutually different times until a time a related one of said N comparison results satisfies a prescribed condition, and yielding N time intervals; and a calculating apparatus for determining an amplitude of a digital representation from one of said N time intervals and knowledge of a related one of said N reference signals.

25. The system according to claim 24, wherein a maximum level of at least one of said N reference signals is greater than a maximum level of said analog signal, and a minimum level of at least one of said N reference signals is less than a minimum level of said analog signal.

26. The system according to claim 24, wherein at least one of said N reference signal sources comprises a signal source for outputting binary signals and a filter for filtering said binary signals.

27. The system according to claim 24, wherein at least one of said N reference signals is a cosine wave signal or a sine wave signal.

28. The system according to claim 16, wherein said system further comprises a calculator for connecting said amplitude to a time having a constant interval.

29. The system according to claim 20, wherein said system further comprises a calculator for connecting said amplitude to a time having a constant interval.

30. The system according to claim 24, wherein said system further comprises a calculator for connecting said amplitude to a time having a constant interval.

* * * * *